US009350528B2

(12) United States Patent
Song

(10) Patent No.: US 9,350,528 B2
(45) Date of Patent: *May 24, 2016

(54) LOW POWER DIGITAL PHASE INTERPOLATOR

(71) Applicant: Intel Corporation, Santa Clara, CA (US)

(72) Inventor: Hongjiang Song, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/608,111

(22) Filed: Jan. 28, 2015

(65) Prior Publication Data

US 2015/0139377 A1    May 21, 2015

Related U.S. Application Data

(63) Continuation of application No. 13/994,627, filed as application No. PCT/US2011/066472 on Dec. 21, 2011, now Pat. No. 8,982,939.

(51) Int. Cl.
| H04L 7/00 | (2006.01) |
| H04L 7/033 | (2006.01) |
| H03H 11/20 | (2006.01) |
| H03H 11/22 | (2006.01) |
| H03C 3/00 | (2006.01) |
| H03H 17/08 | (2006.01) |

(Continued)

(52) U.S. Cl.
CPC ..... *H04L 7/033* (2013.01); *H03C 3/00* (2013.01); *H03H 11/20* (2013.01); *H03H 11/22* (2013.01); *H04L 7/0029* (2013.01); *H03C 2200/002* (2013.01); *H03H 17/08* (2013.01); *H03H 2007/0192* (2013.01); *H03K 17/693* (2013.01)

(58) Field of Classification Search
CPC ....... H03H 11/20; H03H 11/22; H03H 17/08; H03H 2007/0192; H03K 17/693; H03C 2200/002; H04L 7/0029
See application file for complete search history.

(56) References Cited

U.S. PATENT DOCUMENTS

| 6,917,660 B2 | 7/2005 | Song |
| 7,139,544 B2 | 11/2006 | Smith et al. |

(Continued)

OTHER PUBLICATIONS

International Search Report and Written Opinion mailed Aug. 30, 2012 for Int'l Patent Application No. PCT/US2011/066472, Whole Document.

(Continued)

*Primary Examiner* — Kenneth Lam
(74) *Attorney, Agent, or Firm* — Blakely, Sokoloff, Taylor & Zafman LLP

(57) ABSTRACT

Described herein is an apparatus, method and system corresponding to relate to a low power digital phase interpolator (PI). The apparatus comprises: a digital mixer unit to generate phase signals from a series of input signals, the phase signals having phases which are digitally controlled; a poly-phase filter, coupled to the digital mixer unit, to generate a filtered signal by reducing phase error in the phase signals; and an output buffer, coupled to the poly-phase filter, to generate an output signal by buffering the filtered signal. The low power digital PI consumes less power compared to traditional current-mode PIs operating on the same power supply levels because the digital PI is independent of any bias circuit which are needed for current mode PIs.

17 Claims, 13 Drawing Sheets

(51) Int. Cl.
  *H03K 17/693* (2006.01)
  *H03H 7/01* (2006.01)

(56) References Cited

U.S. PATENT DOCUMENTS

| | | | |
|---|---|---|---|
| 7,733,984 B2 | 6/2010 | Baumgartner et al. | |
| 8,982,939 B2 * | 3/2015 | Song | H03H 11/20 375/229 |
| 2004/0158149 A1 | 8/2004 | McLaughlin et al. | |
| 2005/0080564 A1 | 4/2005 | Tso et al. | |
| 2007/0173218 A1 | 7/2007 | Oh et al. | |
| 2008/0089445 A1 | 4/2008 | Kuo et al. | |
| 2008/0132191 A1 | 6/2008 | Quinlan et al. | |
| 2008/0144760 A1 | 6/2008 | Song et al. | |
| 2008/0181340 A1 | 7/2008 | Maxim | |
| 2009/0201064 A1 | 8/2009 | Kim et al. | |
| 2009/0219204 A1 | 9/2009 | Yoo et al. | |
| 2011/0086604 A1 | 4/2011 | Su | |
| 2011/0086605 A1 | 4/2011 | Chanca et al. | |
| 2011/0158358 A1 | 6/2011 | Tseng et al. | |
| 2013/0099871 A1 | 4/2013 | Wang | |

OTHER PUBLICATIONS

International Preliminary Report on Patentability for International Application No. PCT/US2011/066472, mailed Jul. 3, 2014, Whole Document.

"Notice of Allowance for U.S. Appl. No. 13/994,627", (Nov. 12, 2014), Whole Document.

"Office Action for U.S. Appl. No. 13/994,627", (Jul. 22, 2014), Whole Document.

* cited by examiner

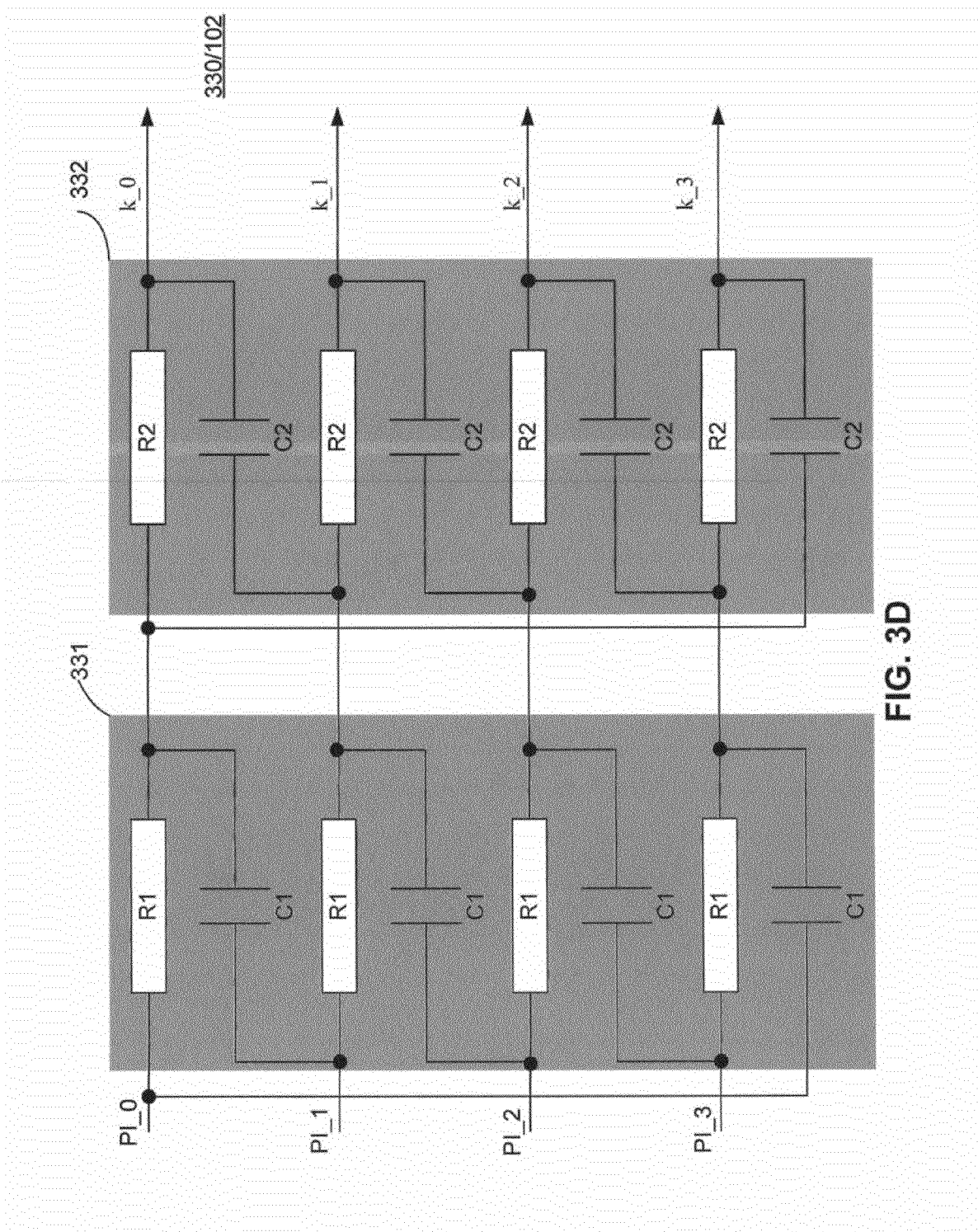

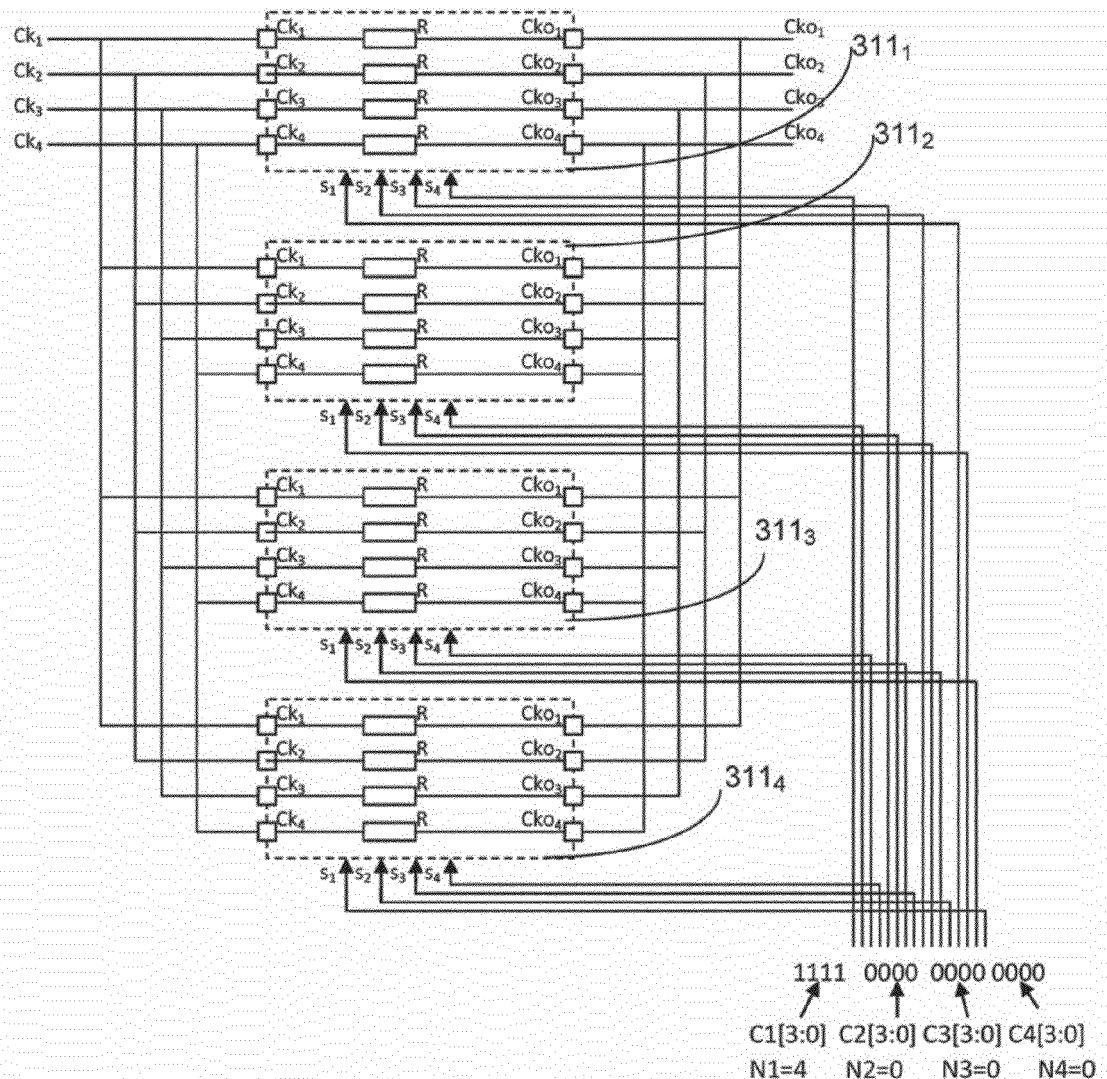
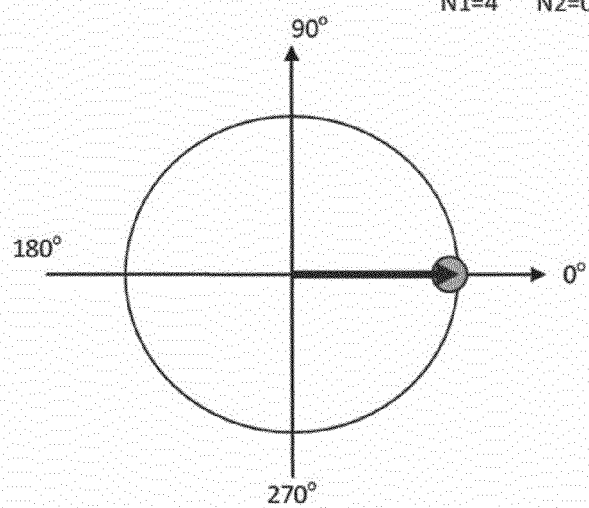
FIG. 4A

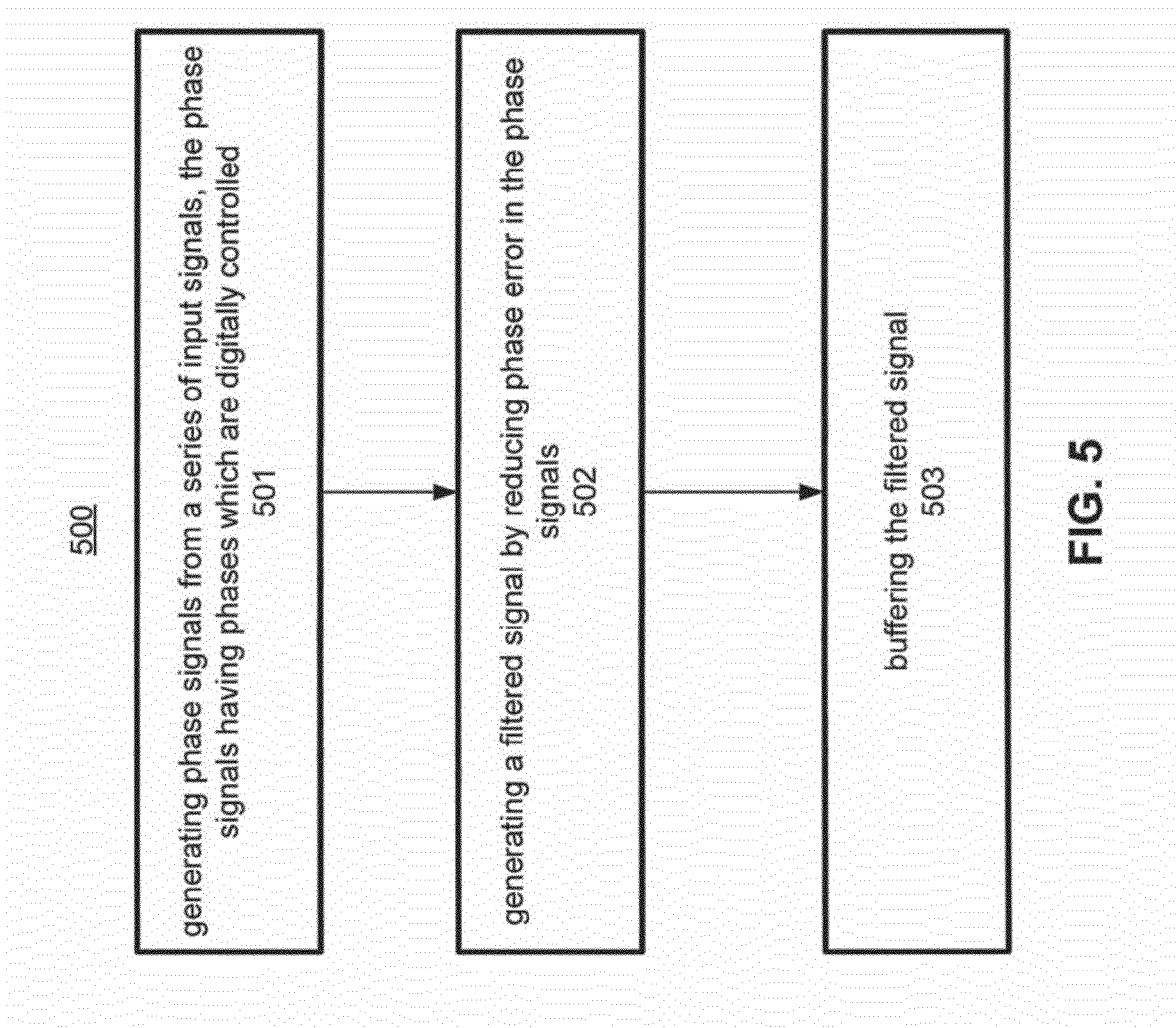

LOW POWER DIGITAL PHASE INTERPOLATOR

CLAIM OF PRIORITY

This application is a continuation of and claims the benefit of priority of U.S. patent application Ser. No. 13/994,627, filed Jun. 14, 2013, titled "Low POWER DIGITAL PHASE INTERPOLATOR," which is a non-provisional application claiming the benefit of priority of International Patent Application No. PCT/US2011/066472 filed Dec. 21, 2011, titled "Low POWER DIGITAL PHASE INTERPOLATOR," which is incorporated by reference in its entirety.

FIELD OF THE INVENTION

Embodiments of the invention relate generally to the field of processors. More particularly, embodiments of the invention relate to a low power digital phase interpolator (PI).

BACKGROUND

Phase interpolators (PIs) are used in many application including high speed input-output (I/O) receivers to generate interpolated signals from input clock signals. These interpolated signals are used to sample input data received by the I/O receiver. As power consumption requirements for a processor are becoming stringent and processors are required to operate at lower power supply levels, for example 0.8V power supply level, performance of traditional analog-based PIs degrade.

The term "performance" herein generally refers to power supply rejection ratio (PSRR), power consumption, process-temperature-voltage (PVT) variations, area, scalability to lower power supply voltages, I/O transfer rate, etc.

A typical PI is a current mode PI. The current mode PI shows poor performance at low power supply levels because the current mode PI, being analog-based design, is highly sensitive to PVT variations, exhibits a lower power supply rejection ratio (PSRR) due to high analog bias dependency on the power supply and due to low swing operation requirements, consumes higher power, and requires complementary metal-oxide semiconductor (CMOS) to current mode logic (CML) and CML to CMOS converters to operate at low voltages resulting in larger area, and has lower I/O transfer rates at lower power supply levels. Such current mode-based PIs are unable to meet the stringent low power specifications of Mobile Industry Processor Interface (MIPI®) as described in the MIPI® Alliance Specification for M-PHY$^{SM}$ Version 1.00.00 of Feb. 8, 2011 and approved on Apr. 28, 2011.

BRIEF DESCRIPTION OF THE DRAWINGS

Embodiments of the invention will be understood more fully from the detailed description given below and from the accompanying drawings of various embodiments of the invention, which, however, should not be taken to limit the invention to the specific embodiments, but are for explanation and understanding only.

FIG. 3D is a two stage poly-phase filter of the low voltage digital PI, according to one embodiment of the invention.

FIGS. 4A-C illustrates the generation of phase-interpolated signals in the multiplexers of the mixer unit of the low voltage digital PI, according to one embodiment of the invention.

FIG. 5 is a method flowchart for generating digital phase-interpolated signals, according to one embodiment of the invention.

SUMMARY

Figure 1A:
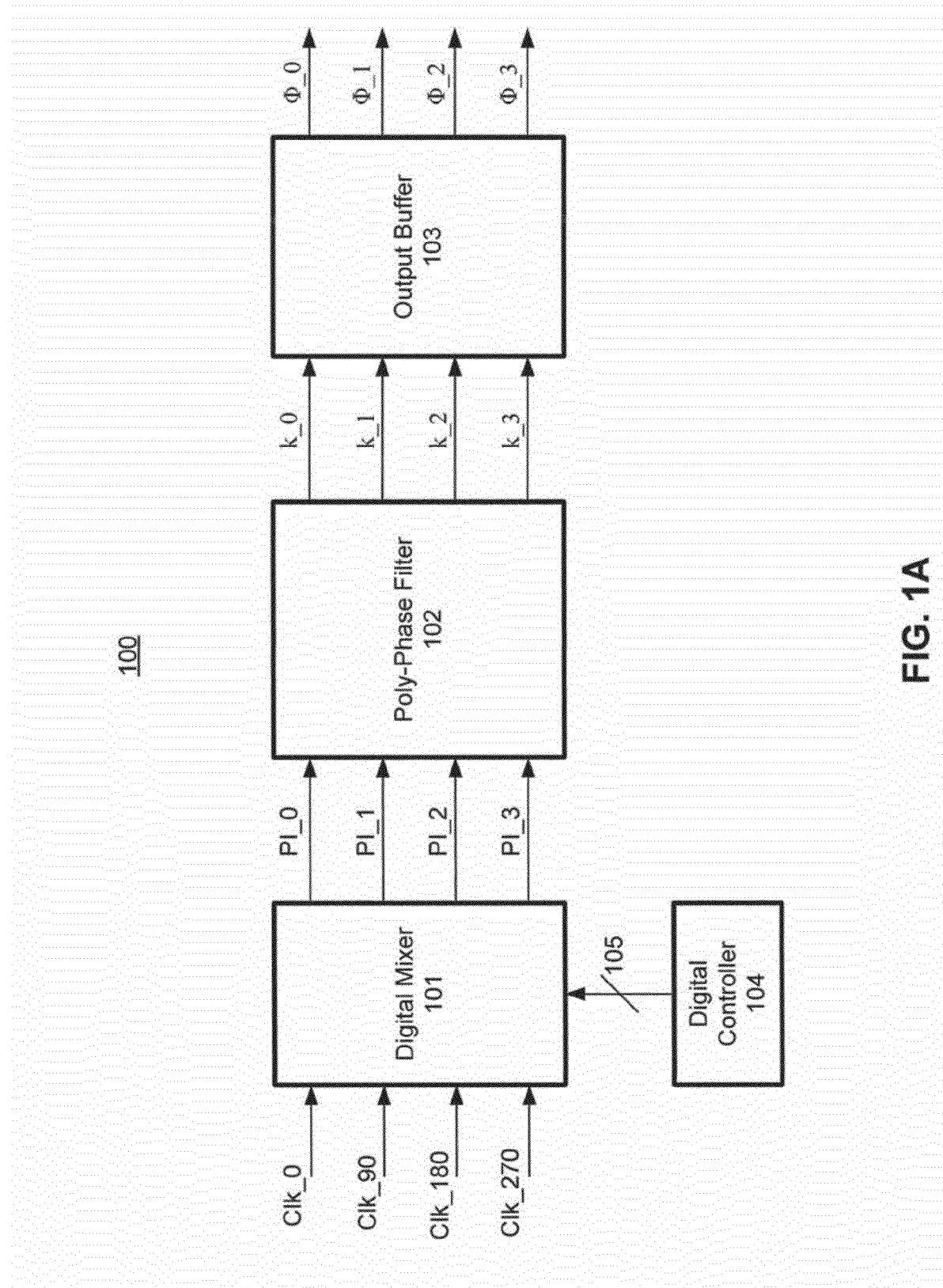
FIG. 1A is a low voltage digital phase interpolator (PI), according to one embodiment of the invention.

The following presents a simplified summary of the embodiments of the invention in order to provide a basic understanding of some aspects of the embodiments. This summary is not an extensive overview of the embodiments of the invention. It is intended to neither identify key or critical elements of the embodiments nor delineate the scope of the embodiments. Its sole purpose is to present some concepts of the embodiments of the invention in a simplified form as a prelude to the more detailed description that is presented later.

Embodiments of the invention relate to apparatus, method, and system corresponding to a low power digital phase interpolator.

In one embodiment, the apparatus comprises: a digital mixer unit to generate phase signals from a series of input signals, the phase signals having phases which are digitally controlled; a poly-phase filter, coupled to the digital mixer unit, to generate a filtered signal by reducing phase error in the phase signals; and an output buffer, coupled to the poly-phase filter, to generate an output signal by buffering the filtered signal.

In one embodiment, the method comprises: generating phase signals from a series of input signals, the phase signals having phases which are digitally controlled; generating a filtered signal by reducing phase error in the phase signals; and buffering the filtered signal.

In one embodiment, the system comprises a display unit (e.g., touch screen or touch pad); and a receiver, coupled to the display unit, having a digital phase interpolator, the digital phase interpolator including: a digital mixer unit to generate phase signals from a series of input signals, the phase signals having phases which are digitally controlled; a poly-phase filter, coupled to the digital mixer unit, to generate a filtered signal by reducing phase error in the phase signals; and an output buffer, coupled to the poly-phase filter, to generate an output signal by buffering the filtered signal, wherein the digital mixer, the poly-phase filter, and the output buffer are positioned in the receiver which is one of: a Mobile Industry Processor Interface (MIPI®) M-PHY$^{(SM)}$ receiver; a Peripheral Component Interconnect Express (PCIe) receiver; a Serial Advanced Technology Attachment (SATA) receiver; a Serial Attached SCSI (SAS) receiver; a Double Data Rate x (DDRx) receiver, were 'x' is an integer; a High-Definition Multimedia Interface (HDMI) receiver; or a Universal Serial Bus x (USBx) receiver, where 'x' is an integer.

The following description and the annexed drawings set forth in detail certain illustrative aspects of the embodiments of the invention. These aspects are indicative, however, of but a few of the various ways in which the principles of the embodiments of the invention may be employed. The embodiments of the invention are intended to embrace all equivalents in the form of alternatives, modifications, and variations that fall within the broad scope of the appended claims. Other advantages and novel features of the embodiments of the invention will become apparent from the following detailed description of the embodiments of the invention when considered in conjunction with the drawings.

DETAILED DESCRIPTION

Embodiments of the invention relate to a low power digital phase interpolator (PI) which is highly scalable over process generations because of its digital architecture which is not sensitive to bias voltage levels as observed in analog circuits. In one embodiment, the low power digital PI applies a ratio-based voltage phase interpolation to a set of quadrature clock signals. In one embodiment, the low power digital PI provides a high power supply rejection ratio (PSRR) by using passive circuit elements (resistors and capacitors) as filtering elements. In one embodiment, the low power digital PI has smaller area than traditional current-mode based PIs because the transistors can be drawn with minimum process dimensions of width and length. In the embodiments discussed herein, the low power digital PI consumes less power compared to traditional current-mode PIs operating on the same power supply levels because the digital PI is independent of any bias circuit which is needed for operating current mode PIs.

In the following description, numerous details are discussed to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

In the following description and claims, the term "coupled" and its derivatives may be used. The term "coupled" herein refers to two or more elements which are in direct contact (physically, electrically, magnetically, optically, etc.). The term "coupled" herein may also refer to two or more elements that are not in direct contact with each other, but still cooperate or interact with each other.

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

FIG. 1A is a low voltage digital PI 100, according to one embodiment of the invention. In one embodiment, the digital PI 100 comprises a mixer unit 101 which receives a set of quadrature clock signals—Clk_0, Clk_90, Clk_180, and Clk_270—and generates interpolated signals—PI_0, PI_1, PI_2, and PI_3—that have phase transitions between the phase transitions of the quadrature clock signals. Unlike traditional mixers, the mixer 101 herein is a digital mixer and does not require any analog bias generation circuit. Being a digital mixer 101, the transistors used to implement the mixer 101 (also called mixer unit 101) are drawn with minimum allowed dimensions of width and length, according to one embodiment of the invention. In one embodiment, the digital mixer 101 receives control or select signals 105 from a digital controller 104. The digital controller 104 is part of a feedback loop that determines the position of the phase transition of the interpolated signals that are used for sampling a signal, for example, a signal received by an I/O receiver.

Figure 1B:
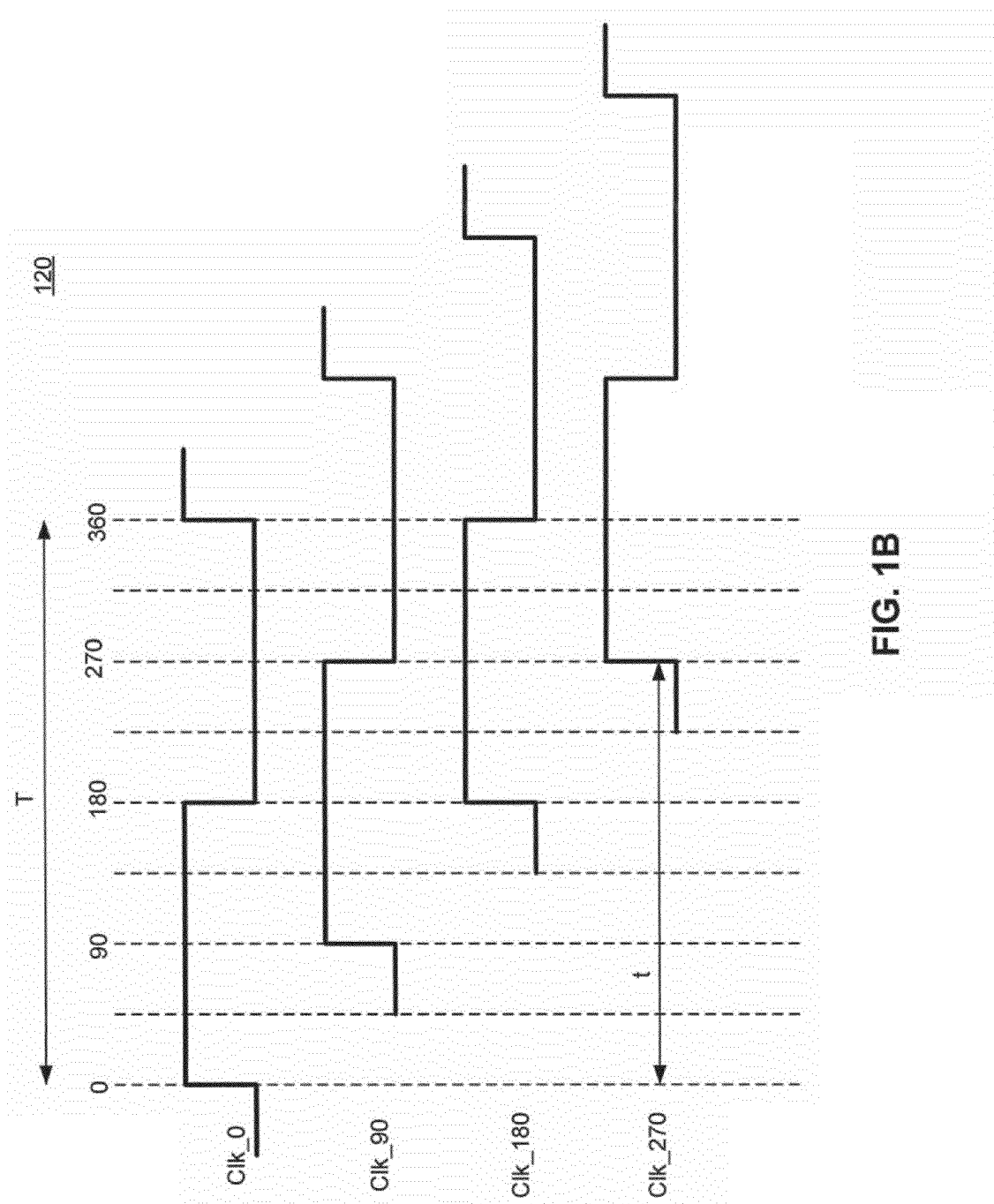
FIG. 1B are waveforms input to a mixer unit of the PI, according to one embodiment of the invention.

FIG. 1B are a set of quadrature clock signals 120—Clk_0, Clk_90, Clk_180, and Clk_270—input to the mixer unit 101 of the digital phase interpolator 100, according to one embodiment of the invention. The terms "0, 90, 180, and 270" for the quadrature clock signals refer to the position in degrees of the phases of the clock signals in degrees relative to Clk_0 signal. The period of each clock signal is 'T,' where 't' is the distance between the transition edge of Clk_0 to the transition edge of any of the remaining quadrature clock signals.

Referring back to FIG. 1A, in one embodiment the digital PI 100 comprises a poly-phase filter (PPF) 102 to provide phase error rejection across PVT corners and across wide frequency ranges. In one embodiment, the PPF 102 is a two stage PPF to provide second order compensation to the errors in phases of PI_0, PI_1, PI_2, and PI_3 signals. In the embodiments discussed herein, the PPF 102 comprises passive elements such as resistors (R) and capacitors (C).

The term "wide frequency ranges" herein refers to at least ranges high speed (HS) GEAR ranges from HS-GEAR 1 to HS-GEAR 3 as described in the MIPI® Alliance Specification for M-PHY$^{SM}$ Version 1.00.00 of Feb. 8, 2011 and approved on Apr. 28, 2011.

FIG. 3D is a two stage PPF 330/102 of the low voltage digital PI 100, according to one embodiment of the invention. In one embodiment, the first stage 331 and the second stage 332 of the two stage PPF 330/102 are coupled in series with one another. Each stage of the PPF 330/102 comprises an RC filter with resistors connected between the input PIN node and an output node, where N=0, 1, 2, and 3, and with cross coupled capacitors, as illustrated in FIG. 3D. In one embodiment, the first stage 331 of the PPF 330/102 comprises a network of series resistors R1 and cross-coupled capacitors C1. In one embodiment, the second stage 332 of the PPF 330/102 comprises a network of series resistors R2 and cross-coupled capacitors C2. The values of R1, C1, R2, and C2 are selected such that the time constant (R1×of the first stage 331 is less than the time constant (R2×C2) of the second stage 332, according to one embodiment of the invention. The output of the two-stage PPF 330/102 comprises the filtered signals k_0, k_1, k_2, and k_3 which are then buffered for sampling purposes.

In one embodiment, the values of the resistors and capacitors—R1, C1, R2, and C2—are digitally programmable by enabling and/or disabling additional resistors and capacitors connected in parallel to the resistors and capacitors R1, C1, R2, and C2. In other embodiments, fuses or metal options may be used to program the values of the resistors and capacitors R1, C1, R2, and C2.

In one embodiment, the first and second stages (331 and 332) of the PPF 330/102 are configured such that the first stage 331 is configured to reduce frequency components of multi-phase clock signals PI_0, PI_1, PI_2, and PI_3 between approximately 10 and 20 percent below an image frequency while the second stage 332 is configured to reduce frequency components of multi-phase clock signals PI_0, PI_1, PI_2, and PI_3 between approximately 10 and 20 percent above the image frequency. In these embodiments, the frequency response of the first stage 331 may have a notch at approximate 10 to 20 percent below the image frequency, and the frequency response of the second stage 332 may have a notch approximate 10 to 20 percent above image frequency. The placement of two stages of the filters may be interchanged, i.e. the first stage 331 is positioned after the second stage 332 such that the first stage 331 generates the filtered signals k_0, k_1, k_2, and k_3, according to one embodiment.

Referring back to FIG. 1A, the digital PI 100 further comprises an output buffer 103 (also called logic unit) to buffer the filtered signals k_0, k_1, k_2, and k_3 as final phase-interpolated signals Φ0, Φ1, Φ2, and Φ3, where Φ0 (first phase) has a transition edge in a middle of a phase of a data signal (or received signal which is being sampled), where Φ1 (second phase) has a transition edge at a crossing of a phase of the data signal and a successive phase of the data signal, where Φ2 (third phase) has a transition edge in a middle of the successive phase of the data signal, and where Φ3 (fourth phase) has a transition edge at the end of the phase of the successive phase of the data signal.

Figure 3A:
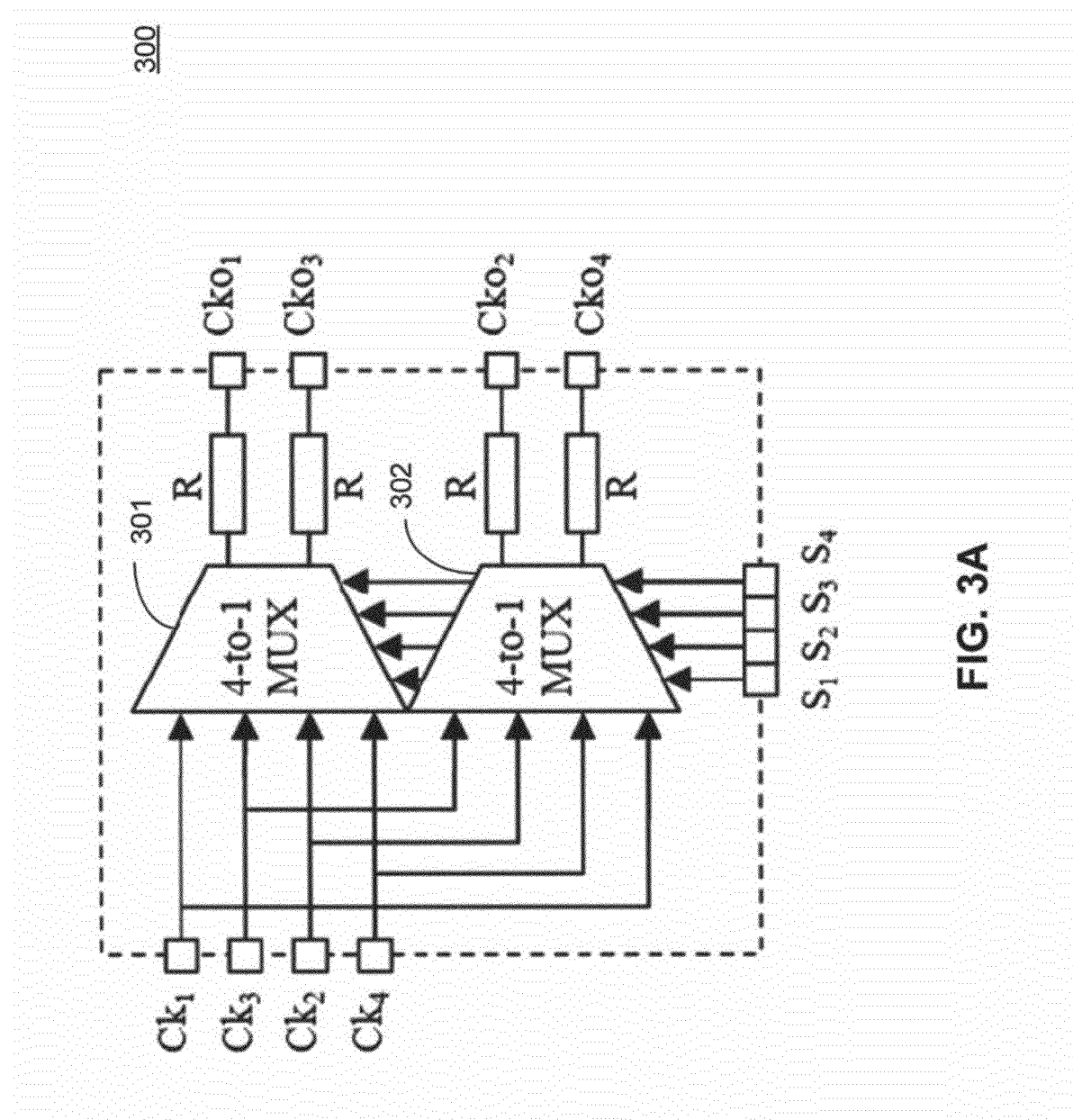
FIGS. 3A-B are multiplexer-based implementations of the mixer unit, according to one embodiment of the invention.
Figure 3B:
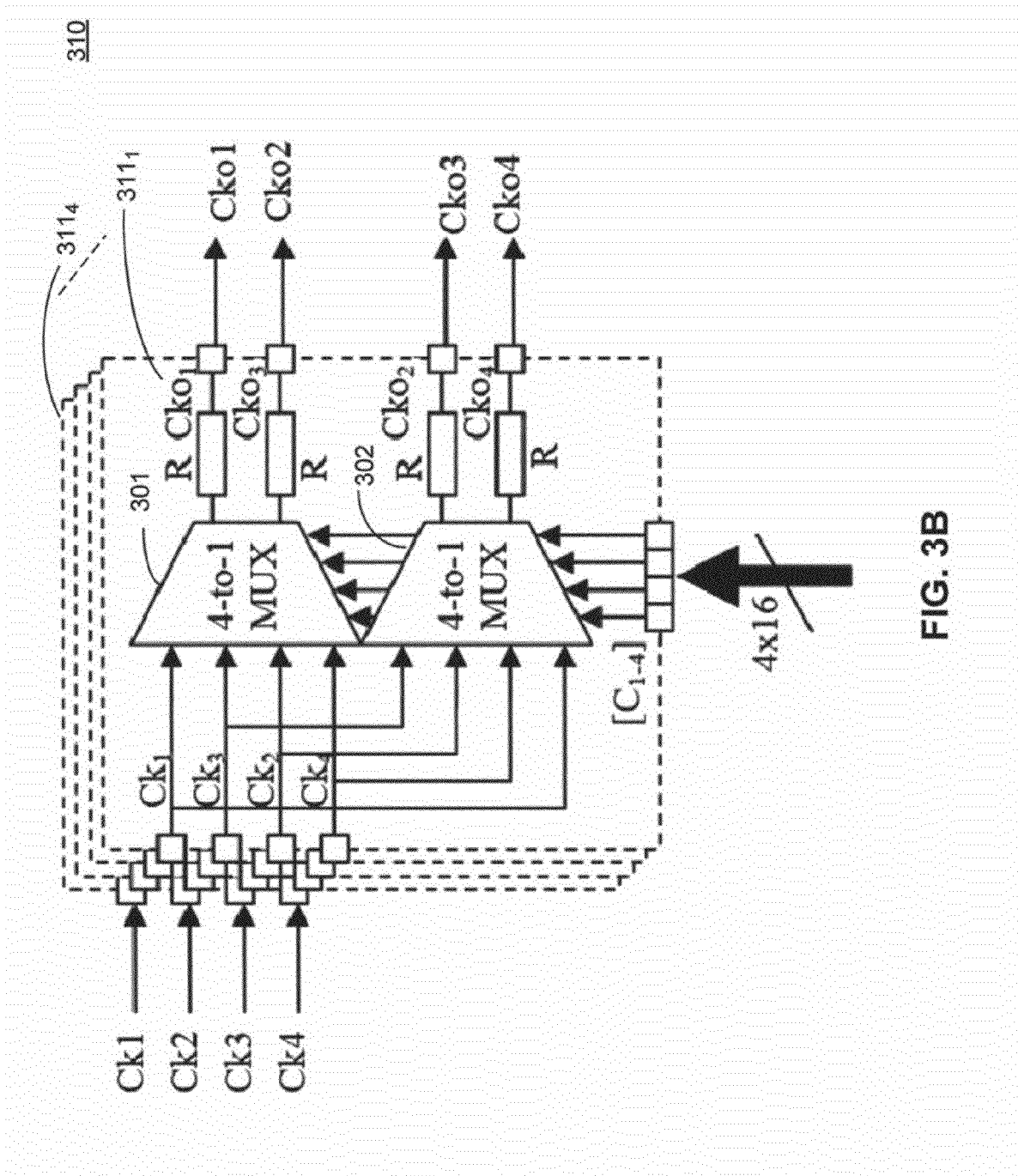
Figure 3C:
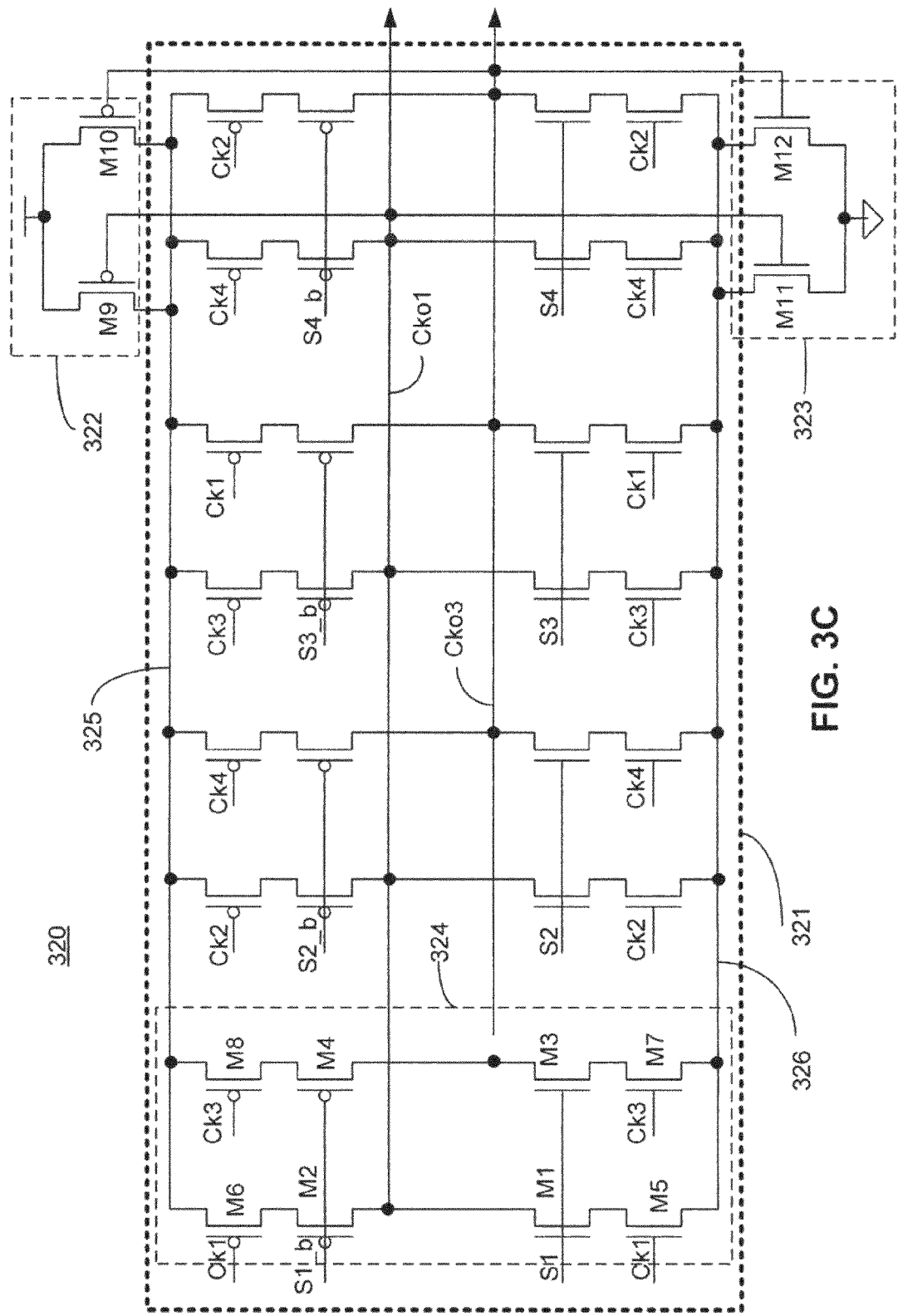
FIG. 3C is a transistor-level implementation of the multiplexer, according to one embodiment of the invention.
Figure 3E:
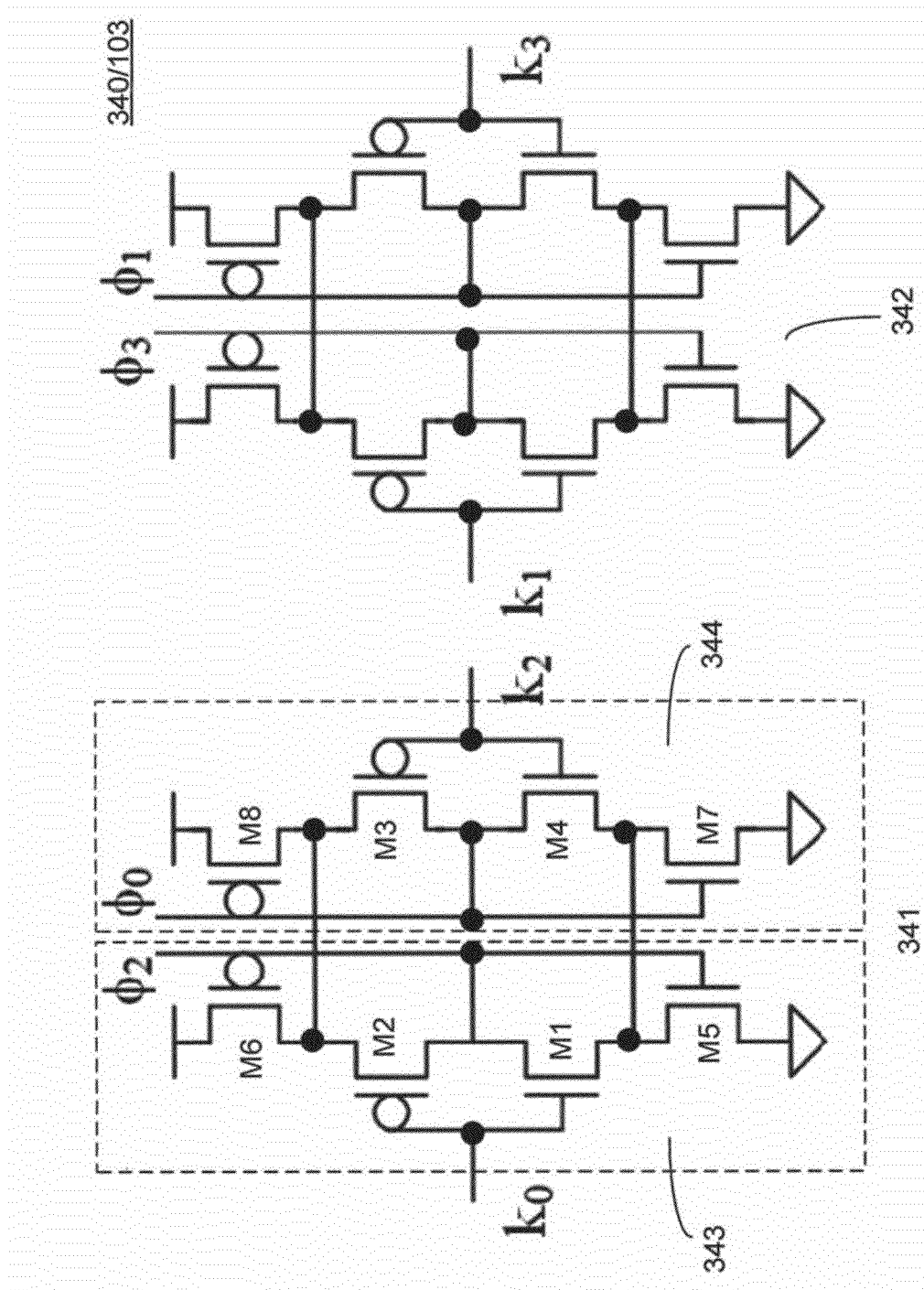
FIG. 3E is a differential output buffer of the low voltage digital PI, according to one embodiment of the invention.

FIG. 3E is an implementation of the output buffer 103, according to one embodiment of the invention. In this embodiment, the output buffer 103 is pair of differential output buffers 341 and 342. In one embodiment, the output buffer 103 is a self-biased symmetrical load output buffer circuit. The following description is presented with reference to the buffer 341. The same description applies to the buffer 342. In one embodiment, the differential output buffers 341 and 342 receive as inputs the filtered signals k_0, k_1, k_2, and k_3 from the PPF 102 and generates differential interpolated signals Φ0, Φ1, Φ2, and Φ3.

In one embodiment, the output buffer 341 comprises two CMOS transistor pairs (M1, M2, and M3, M4) that are used as the input devices, which extend the input signal to full swing. In one embodiment, additional CMOS transistor pairs (M5, M6, and M7, M8) are used for either current biases or loads. The gates of the bias/load branches may be coupled together as illustrated. In these embodiments, circuits 343 and 344 are symmetric at both left-to-right and top-to-bottom directions. Three feedback loops are provided in the circuit structure, including a left loop by transistors M1, M2, M5, and M6, a right loop by transistors M3, M4, M7, and M8, and a common mode loop by transistors M5, M6, M7, and M8.

The embodiment of the output buffer 340 provides higher bias current around the cross point to achieve approximately zero DC bias, high speed switching, and a "soft landing" (e.g., substantially avoiding noise and glitches in the signal). These properties help make the output buffer 340 more robust for various applications (e.g., large power supply range, rail-to-rail signal swings, large transistor size range, etc.,) and scalable for different manufacture process technologies.

Referring back to FIG. 1A, in one embodiment the mixer unit 101 is implemented with programmable multiplexers that provide common mode (CM) rejection for the output signals PI_0, PI_1, PI_2, and PI_3. The mixer unit 101 is described with reference to FIGS. 3A-C and FIGS. 4A-C.

FIG. 3A is a single slice of multiplexer 300 based implementations of the mixer 101 while FIG. 3B are four slices 310 of the multiplexer-based implementations of the mixer 101, according to one embodiment of the invention. The following description is provided for FIG. 3A with reference to FIG. 3C. The same description is applicable to the embodiment of FIG. 3B.

The single slice of multiplex 300 comprises at least to 4-to-1 multiplexers 301 and 302 which are configured to receive input quadrature clock signals $Ck_{1-4}$ which directly correspond to Clk_0, Clk_90, Clk_180, and Clk_270 signals respectively. The 4-to-1 multiplexers 301 and 302 are selectable by four bit input signals $S_{14}$ that determine the phase location of the output signals Cko_1, Cko_2, Cko_3, and Cko_4 that directly correspond to signals PI_0, PI_1, PI_2, and PI_3 respectively. The output signals Cko_1, Cko_2, Cko_3, and Cko_4 are generated by weighted voltage summation of two differential clock signals from among the signals Clk_0, Clk_90, Clk_180, and Clk_270. In such an embodiment, the mixer unit 101 of the PI 100 is implemented in digital form using digital pass-gates. No analog bias voltages are used in these embodiments.

In one embodiment, a series resistance (R) is added between the output of the 4-to-1 multiplexers 301 and 302 and the final output of the multiplexer 300. One reason for adding the series resistance is to filter noise in the signals generated by the 4-to-1 multiplexers 301 and 302. In the embodiments discussed herein, the 4-to-1 multiplexers 301 and 302 are differential multiplexers such that each 4-to-1 multiplexer is operable to generate two output signals Cko_1 and Cko_3 signals which directly correspond to PI_0 and PI_2 respectively.

FIG. 3C is a transistor-level implementation 320 of the 4-to-1 multiplexer 301 or 302 of FIGS. 3A-B, according to one embodiment of the invention. In one embodiment, the circuit of 320 comprises three components including a differential mixer unit 321 and CM rejection units 322 and 323. In one embodiment, the differential mixer unit 321 comprises four pairs of stacked P and N transistors with outputs shorted together with different pairs. Each pair has an identical structure, according to one embodiment of the invention. So as not to obscure the embodiment of FIG. 3C, the structure of only one pair 324 is described. The same explanation is valid for the other three pairs.

In one embodiment, the pair 324 comprises a pair of stacked P and N transistors $M_{1-8}$ connected together as illustrated in FIG. 3C. In one embodiment, each pair within the pair 324 receives a different clock signal from among the quadrature clock signals Ck_1, Ck_2, Ck_3, and Ck_4. In one embodiment, each of the four pairs is digitally controlled by select signals S1, S2, S3, and S4 of FIG. 3A respectively. The pair 324, for example, is controlled by the select signal S1 and its corresponding inverted signal S1_b. In one embodiment, the output of the first pair (left pair) within the pair (e.g., pair 324) is shorted with the output of the first pair (left pair) of the other remaining three pairs of 321 to generate the final output Cko1 (which corresponding to PI_0). In such an embodiment, the output of the second pair (right pair) within the pair (e.g., pair 324) is shorted with the output of the first pair (right pair) of the other remaining three pairs of 321 to generate the final output Cko3 (which corresponds to PI_2).

In one embodiment, a pair of CM rejection units 322 and 323 is added to the output signals Cko1 and Cko3. In one embodiment, the CM rejection unit 322 comprises P-transistors coupled between power supply and source terminals of the P-transistors of the four pairs discussed with reference to 321. In one embodiment, the CM rejection unit 322 provides a virtual power supply node 325 to the differential mixer 321. In one embodiment, the CM rejection unit 322 comprises a pair of P-transistors M9 and M10 with their gates controlled by Cko1 and Cko3 signals respectively. In one embodiment, the CM rejection unit 323 comprises N-transistors coupled between ground and source terminals of the N-transistors of the four pairs discussed with reference to 321. In one embodiment, the CM rejection unit 323 provides a virtual ground node 326 to the differential mixer 321. In one embodiment, the CM rejection unit 323 comprises a pair of N-transistors M11 and M12 with their gates controlled by Cko1 and Cko3 signals respectively.

Referring back to FIG. 3B, in one embodiment, a bus of 64 bits is used for controlling the four slices 310 of multiplexers $311_{1-4}$. In such an embodiment, the output of each of the four bit slices is merged together. For example, Cko1 of the multiplexer unit $311_1$ is merged with Cko1 of the other three multiplexer units $311_{2-4}$, Cko3 of the multiplexer unit $311_1$ is merged with Cko3 of the other three multiplexer units $311_{2-4}$, etc.

As mentioned above, the output signals Cko1, Cko2, Cko3, and Cko4 from the mixer unit 101 are generated by weighted voltage summation of two differential clock signals from among the signals Clk_0, Clk_90, Clk_180, and Clk_270. For illustrating the operation of the weighted voltage summation for Cko1, assume that each (e.g., 324) of the four pairs in 321 of FIG. 3C generate an output signal described as $R/N_1$, $R/N_2$, $R/N_3$, and $R/N_4$, where $N_{1-4}$ are digitally programmed by the logic unit 104.

In the above example, when $N_1+N_2=N$ and $N_3=N_4=0$, then the output clock phase of Cko1 is given by $(N_2/N)(T/4)$ which generates a phase PI_1 between 0 and 90 degrees, where N=64 (corresponding to the 64 select bits for the four slices of multiplexers 310), and where 'T' is the period of the input clock signal Clk_0 as shown in FIG. 1B. When any of the $N_{1-4}$ is equal to zero, it implies infinite output impedance from that branch of the four voltage summation branches—$R/N_1$, $R/N_2$, $R/N_3$, and $R/N_4$.

When $N_2+N_3=N$ and $N_4=N_1=0$, then the output clock phase of Cko1 is given by $(T/4)+(N_3/N)(T/4)$ which generates a phase between 90 and 180 degrees. When $N_3+N_4=N$ and $N_2=N_3=0$, then the output clock phase of Cko1 is given by $((2T)/4)+(N_4/N)(T/4)$ which generates a phase between 180 and 270 degrees. In the embodiments discussed herein, in each multiplexer slice ($311_{1-4}$), the 4-to-1 multiplexer is used to switch the connection of the load resistor (R) to realize the programming of $N_{1-4}$ as discussed herein.

Figure 4B:
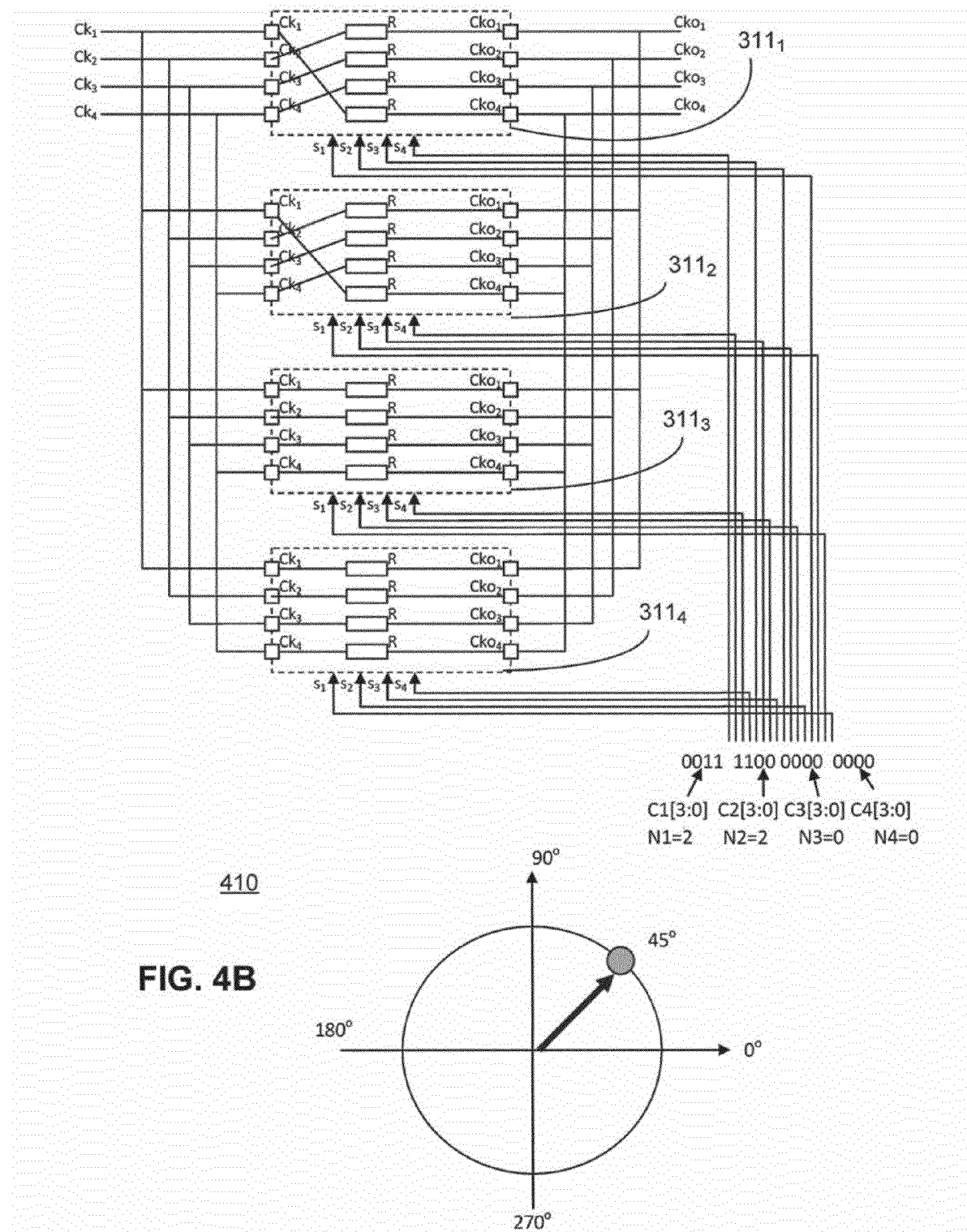
Figure 4C:
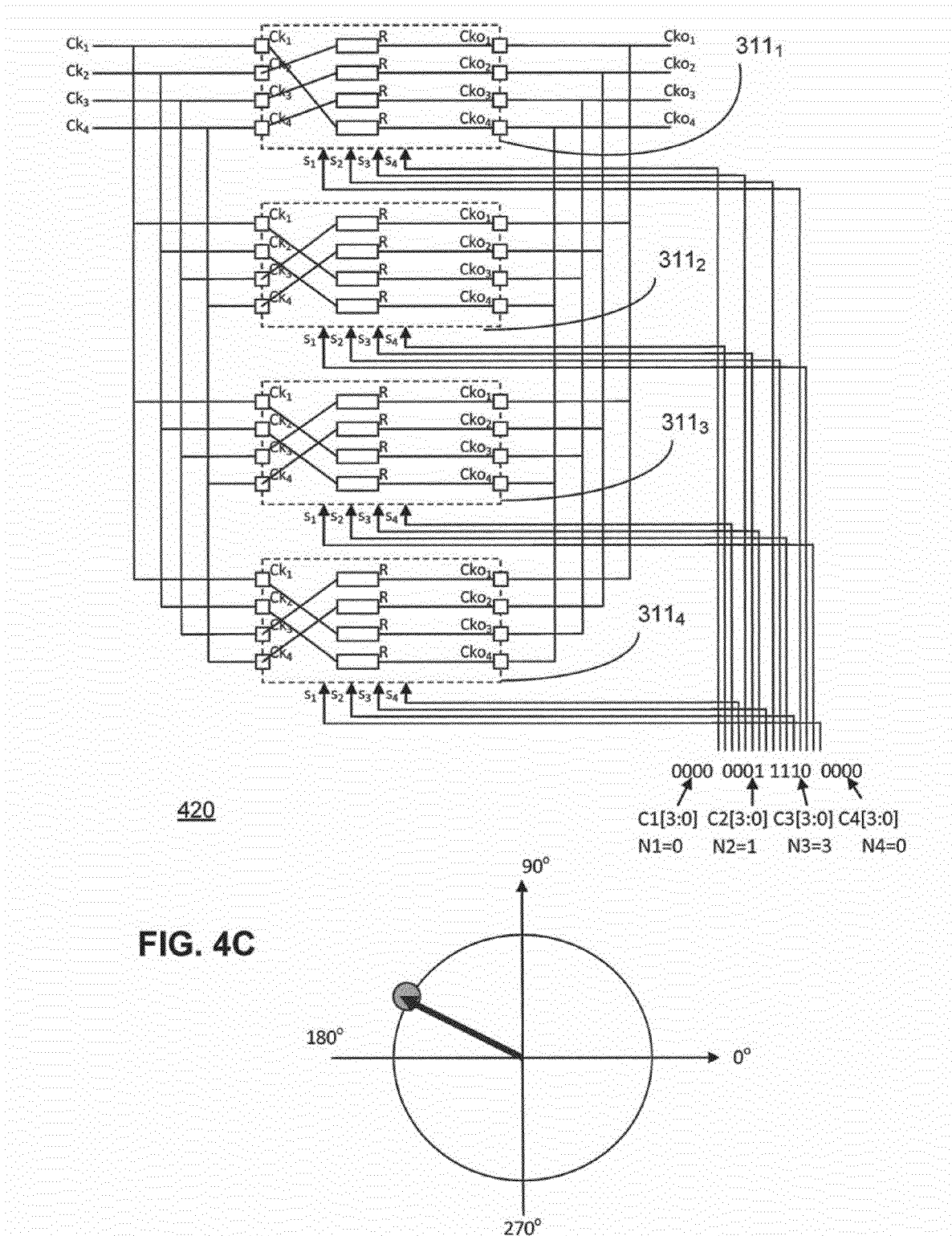

FIGS. 4A-C illustrates the generation of phase-interpolated signals by the mixer unit 101 of the low voltage digital PI 100, according to one embodiment of the invention. FIG. 4A illustrates the control settings 400 for C1-C4 that control the four slices of multiplexers $311_{1-4}$ to generate an output Cko1-4 that are not phase-interpolated, i.e. all input clock signals Clk1-4 (interchangeably referred as $Ck_{1-4}$) are output as Cko1-4 respectively without any mixing of the signals to generate interpolated signals. The interpolation circle of FIG. 4A illustrates an interpolation of zero degrees, i.e. no interpolation, when $N_1=4$, $N_2=N_3=N_4=0$. Corresponding values of C1-C4 are shown in FIG. 4A. A person skilled in the art would appreciate that "C1[3:0]" represents a four bit C1 word.

FIG. 4B illustrates the control settings 410 for C1-C4 that control the four slices of multiplexers $311_{1-4}$ to generate an output Cko1-4 which are phase-interpolated by 45 degrees. The interpolation circle of FIG. 4B illustrates an interpolation of 45 degrees when $N_1=2$, $N_2=2$, and $N_3=N_4=0$. Corresponding values of C1-C4 are shown in FIG. 4B.

FIG. 4C illustrates the control settings 420 for C1-C4 that control the four slices of multiplexers $311_{1-4}$ to generate an output Cko1-4 which are phase-interpolated by approximately 140 degrees. The interpolation circle of FIG. 4C illustrates an interpolation of approximately 140 degrees when $N_1=0$, $N_2=1$, $N_3=3$, and $N_4=0$. Corresponding values of C1-C4 are shown in FIG. 4C.

Figure 2:
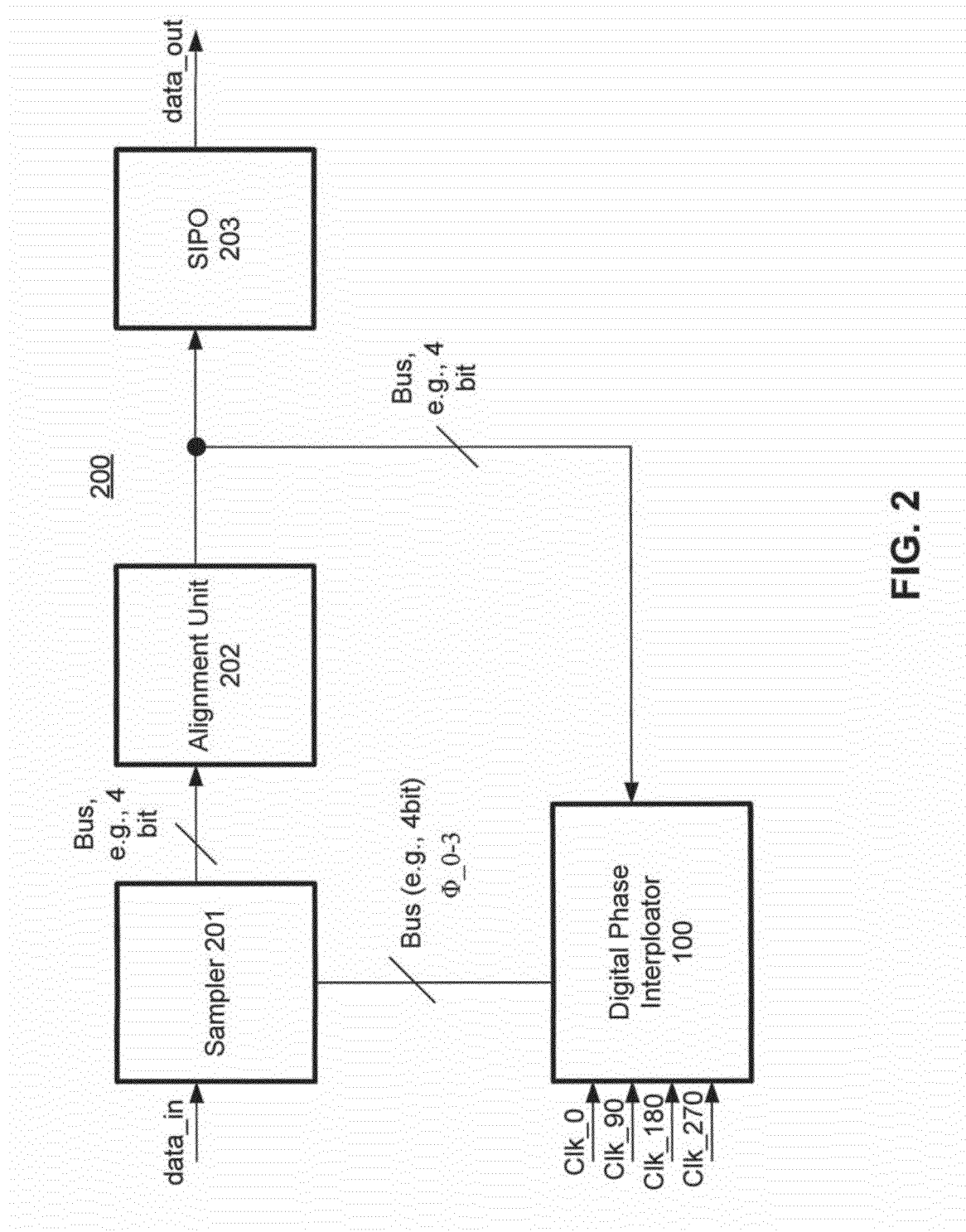
FIG. 2 is an input-output (I/O) receiver unit with the low voltage digital PI, according to one embodiment of the invention.

FIG. 2 is an I/O receiver unit 200 with the low voltage digital PI 100, according to one embodiment of the invention. In one embodiment, a differential input data data_in from an I/O transmitter (not shown) is sampled by a sampler 201. The sampler 201 is operable to sample the input data_in signal using the interpolated signals Φ1, Φ1, Φ2, and Φ3, where Φ0 (first phase) has a transition edge in a middle of a phase of the data_in signal, where Φ1 (second phase) has a transition edge at a crossing of a phase of the data_in signal and a successive phase of the data signal, where Φ2 (third phase) has a transition edge in a middle of the successive phase of the data_in signal, and where Φ3 (fourth phase) has a transition edge at the end of the phase of the successive phase of the data_in signal.

In one embodiment, the receiver unit 200 comprises an alignment unit 202 which receives the sampled data_in signals, sampled by Φ0, Φ1, Φ2, and Φ3 and generates output signals which are synchronized to the transmit clock signal domain. The alignment unit 202 is also called the synchronization unit. The output of the alignment unit 202 is then input to the digital control unit 104 of the PI 100, where the digital control unit 104 determines from the aligned signals (output of the alignment unit 202) whether the phases Φ0, Φ1, Φ2, and Φ3 are properly positioned in time, i.e., whether they are phase shifted to sample the data_in signal at the four points discussed above. The digital control unit 104 then selects the appropriate S1-S4 signals, i.e. C1[3:0], C2[3:0], C3[3:0], and C4[3:0] control signals, by selecting the appropriate $N_{1-4}$ values for the mixer unit 101.

In one embodiment, the receiver unit 200 comprises a serial-in-serial-out (SIPO) 203 unit that generates the data out signal which is then processed by other logic units (not shown) of the processor comprising the I/O receiver 200. The I/O receiver can be used as a Mobile Industry Processor Interface (MIPI®) M-PHY$^{(SM)}$ receiver; a Peripheral Component Interconnect Express (PCIe) receiver; a Serial Advanced Technology Attachment (SATA) receiver; a Serial Attached SCSI (SAS) receiver; a Double Data Rate x (DDRx) receiver, were 'x' is an integer, for example, x=4 and above; a High-Definition Multimedia Interface (HDMI) receiver; or a Universal Serial Bus x (USBx) receiver, where 'x' is an integer, for example x=2 and above.

FIG. 5 is a method flowchart 500 for generating digital phase-interpolated signals, according to one embodiment of the invention. Although the blocks in the flowchart 500 are shown in a particular order, the order of the actions can be modified. Thus, the illustrated embodiments can be performed in a different order, and some actions/blocks may be performed in parallel. Additionally, one or more actions/blocks can be omitted in various embodiments for generating digital phase-interpolated signals using the low power digital PI 100. The flowchart of FIG. 5 is illustrated with reference to the embodiments of FIGS. 1-4.

At block 501, the mixer 101 generates phase signals (PI_0, PI_1, PI_2, and PI_3) from a series of input signals (quadrature clock signals Clk_0, Clk_90, Clk_180, Clk_270), wherein the phase signals have phases which are digitally controlled by the logic unit 104. The term "controlled" herein refers to selecting the control signals to the multiplexer 300 by the logic unit 104 to move the phase of the PI_0, PI_1, PI_2, and PI_3 signals relative to Clk_0 input signal. At block 502, the PPF 102 generates filtered signals k_0, k_1, k_2, and k_3 by reducing phase error in the phase signals PI_0, PI_1, PI_2, and PI_3. At block 503, the output buffer 103 buffers the filtered signals k_0, k_1, k_2, and k_3 to generate the final phase-interpolated signals Φ0, Φ1, Φ2, and Φ3.

Figure 6:
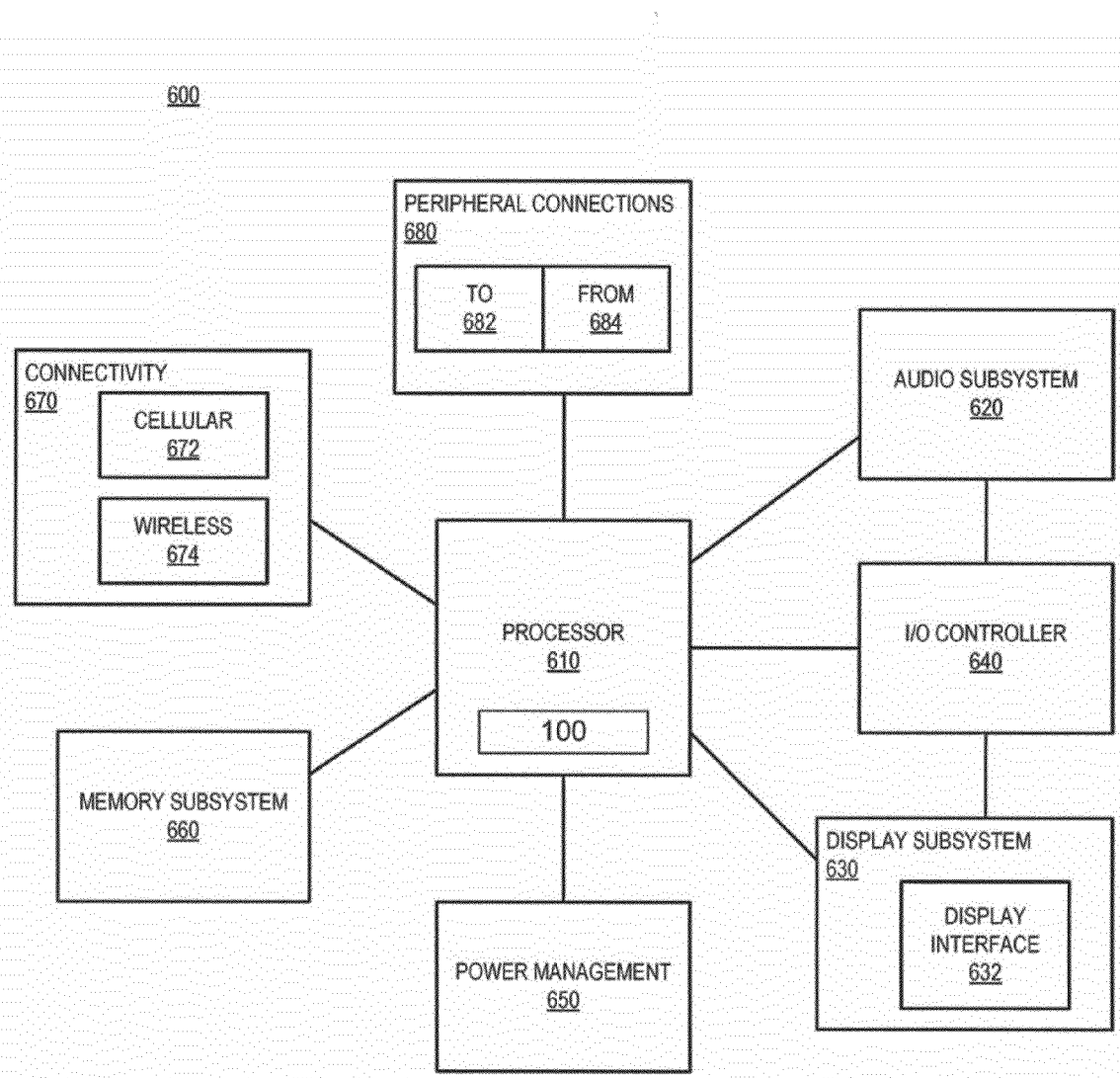
FIG. 6 is a system-level diagram of a smart device comprising a processor including the low voltage PI, according to one embodiment of the invention.

FIG. 6 is a system-level diagram of a smart device comprising a processor including the low voltage PI 100, according to one embodiment of the invention. FIG. 6 also illustrates a block diagram of an embodiment of a mobile device in which flat surface interface connectors could be used. Computing device 600 represents a mobile computing device, such as a computing tablet, a mobile phone or smart-phone, a wireless-enabled e-reader, or other wireless mobile device. It will be understood that certain of the components are shown generally, and not all components of such a device are shown in device 600.

Device 600 includes processor 610, which performs the primary processing operations of device 600. In one embodiment, the processor 610 includes the digital PI 100 in the receiver 200 as discussed with reference to FIGS. 1-4.

Referring back to FIG. 6, the processor 610 can include one or more physical devices, such as microprocessors, application processors, microcontrollers, programmable logic devices, or other processing means. The processing operations performed by processor 610 include the execution of an operating platform or operating system on which applications and/or device functions are executed. The processing operations include operations related to I/O (input/output) with a human user or with other devices, operations related to power management, and/or operations related to connecting device 600 to another device. The processing operations may also include operations related to audio I/O and/or display I/O.

In one embodiment, device 600 includes audio subsystem 620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 600, or connected to device 600. In one embodiment, a user interacts with device 600 by providing audio commands that are received and processed by processor 610.

Display subsystem 630 represents hardware (e.g., display devices) and software (e.g., drivers) components that provide a visual and/or tactile display for a user to interact with the computing device. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touch screen (or touch pad) device that provides both output and input to a user.

I/O controller 640 represents hardware devices and software components related to interaction with a user. I/O controller 640 can operate to manage hardware that is part of audio subsystem 620 and/or display subsystem 630. Additionally, I/O controller 640 illustrates a connection point for additional devices that connect to device 600 through which a user might interact with the system. For example, devices that can be attached to device 600 might include microphone devices, speaker or stereo systems, video systems or other display device, keyboard or keypad devices, or other I/O devices for use with specific applications such as card readers or other devices.

As mentioned above, I/O controller 640 can interact with audio subsystem 620 and/or display subsystem 630. For example, input through a microphone or other audio device can provide input or commands for one or more applications or functions of device 600. Additionally, audio output can be provided instead of or in addition to display output. In another example, if display subsystem includes a touch screen, the display device also acts as an input device, which can be at least partially managed by I/O controller 640. There can also be additional buttons or switches on device 600 to provide I/O functions managed by I/O controller 640.

In one embodiment, the I/O controller 640 manages devices such as accelerometers, cameras, light sensors or other environmental sensors, or other hardware that can be included in device 600. The input can be part of direct user interaction, as well as providing environmental input to the system to influence its operations (such as filtering for noise, adjusting displays for brightness detection, applying a flash for a camera, or other features).

In one embodiment, device 600 includes power management 650 that manages battery power usage, charging of the battery, and features related to power saving operation. Memory subsystem 660 includes memory devices for storing information in device 600. Memory can include nonvolatile (state does not change if power to the memory device is interrupted) and/or volatile (state is indeterminate if power to the memory device is interrupted) memory devices. Memory 660 can store application data, user data, music, photos, documents, or other data, as well as system data (whether long-term or temporary) related to the execution of the applications and functions of system 600.

Elements of embodiments are also provided as a machine-readable medium (e.g., memory 660) for storing the computer-executable instructions (e.g., instructions to implement the flowchart of FIG. 5 and any other processes discussed above). The machine-readable medium (e.g., memory 660) may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the invention may be downloaded as a computer program (e.g., BIOS) which may be transferred from a remote computer (e.g., a server) to a requesting computer (e.g., a client) by way of data signals via a communication link (e.g., a modem or network connection).

Connectivity 670 includes hardware devices (e.g., wireless and/or wired connectors and communication hardware) and software components (e.g., drivers, protocol stacks) to enable device 600 to communicate with external devices. The device could be separate devices, such as other computing devices, wireless access points or base stations, as well as peripherals such as headsets, printers, or other devices.

Connectivity 670 can include multiple different types of connectivity. To generalize, device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 674 refers to wireless connectivity that is not cellular, and can include personal area networks (such as Bluetooth, Near Field, etc), local area networks (such as Wi-Fi), and/or wide area networks (such as WiMax), or other wireless communication.

Peripheral connections 680 include hardware interfaces and connectors, as well as software components (e.g., drivers, protocol stacks) to make peripheral connections. It will be understood that device 600 could both be a peripheral device ("to" 682) to other computing devices, as well as have peripheral devices ("from" 684) connected to it. Device 600 commonly has a "docking" connector to connect to other computing devices for purposes such as managing (e.g., downloading and/or uploading, changing, synchronizing) content on device 600. Additionally, a docking connector can allow device 600 to connect to certain peripherals that allow device 600 to control content output, for example, to audio-visual or other systems.

In addition to a proprietary docking connector or other proprietary connection hardware, device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

While the invention has been described in conjunction with specific embodiments thereof, many alternatives, modifications and variations of such embodiments will be apparent to those of ordinary skill in the art in light of the foregoing description.

For example, the PPF 102 may be a single stage PPF comprising only the first stage 331 of PPF 300/102. In such and embodiment, the area of the PPF 102 is reduced. In another embodiment, the PPF 102 includes an LRC passive network comprising a network of resistive elements (R), inductive elements (L) and capacitive elements (C) selected to reduce image frequency that may be present in multi-phase clock signals PI_0, PI_1, PI_2, and PI_3. Furthermore, while the digital PI 100 is discussed with reference to an I/O receiver, it may be used in any circuit architecture where multiple phase output signals are required.

The embodiments of the invention are intended to embrace all such alternatives, modifications, and variations as to fall within the broad scope of the appended claims.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

I claim:

1. A receiver circuit comprising:
    a digital phase interpolator including:
        a digital mixer to receive a plurality of clock signals and to generate phase signals based on the plurality of clock signals, wherein respective transitions of the phase signals are between transitions of the plurality of clock signals;
        a poly-phase filter, coupled to the digital mixer, to receive the phase signals and to generate a filtered signal, including the poly-phase filter to reduce a phase error of the phase signals;
        an output buffer, coupled to the poly-phase filter, to buffer the filtered signal and to generate a phase-interpolated signal based on the filtered signal; and
        a controller to digitally control generation of the phase signals by the digital mixer unit;
    a sampler coupled to the digital phase interpolator, the sampler to receive the phase-interpolated signal and to sample a signal based on the phase-interpolated signal; and
    an alignment unit to receive the sampled signal and to generate, based on the sampled signal, an output signal synchronized to a transmit clock signal domain;
    wherein the controller to receive a feedback based on the output signal, wherein the controller to digitally control generation of the phase signals based on the feedback.

2. The receiver circuit of claim 1, wherein the sampler to sample the signal based on the phase-interpolated signal includes the sampler to sample a data signal.

3. The receiver circuit of claim 1, wherein the plurality of clock signals include quadrature clock signals.

4. The receiver circuit of claim 3, wherein the digital mixer comprises a digital differential multiplexer which is operable to select one or more of the quadrature clock signals via digital input signals from the controller.

5. The receiver circuit of claim 4, wherein the digital differential multiplexer comprises P and N transistors controlled by the digital differential multiplexer to provide common mode rejection to the phase signals.

6. The receiver circuit of claim 4, wherein the digital input signals to cause the digital differential multiplexer to generate the phase signals with at least one or more of:
    a first phase with a transition edge in a middle of a phase of the signal;
    a second phase with a transition edge at a crossing of a phase of the signal and a successive phase of the signal;
    a third phase with a transition edge in a middle of the successive phase of the signal; and
    a fourth phase with a transition edge at the end of the phase of the successive phase of the signal.

7. A digital phase interpolator comprising:
    a digital mixer to receive a plurality of clock signals and to generate phase signals based on the plurality of clock signals, wherein respective transitions of the phase signals are between transitions of the plurality of clock signals;
    a poly-phase filter, coupled to the digital mixer, to receive the phase signals and to generate a filtered signal, including the poly-phase filter to reduce a phase error of the phase signals;
    an output buffer, coupled to the poly-phase filter, to buffer the filtered signal and to generate a phase-interpolated signal based on the filtered signal; and
    a controller to receive a feedback signal based on the phase-interpolated signal and, based on the feedback signal, to digitally control generation of the phase signals by the digital mixer unit.

8. The digital phase interpolator of claim 7, wherein the plurality of clock signals include quadrature clock signals.

9. The digital phase interpolator of claim 8, wherein the digital mixer comprises a digital differential multiplexer which is operable to select one or more of the quadrature clock signals via digital input signals from the controller.

10. The digital phase interpolator of claim 9, wherein the digital differential multiplexer comprises P and N transistors controlled by the digital differential multiplexer to provide common mode rejection to the phase signals.

11. The digital phase interpolator of claim 9, wherein the digital input signals to cause the digital differential multiplexer to generate the phase signals with at least one or more of:
 a first phase with a transition edge in a middle of a phase of the signal;
 a second phase with a transition edge at a crossing of a phase of the signal and a successive phase of the signal;
 a third phase with a transition edge in a middle of the successive phase of the signal; and
 a fourth phase with a transition edge at the end of the phase of the successive phase of the signal.

12. A tablet computer comprising:
 a display unit including a touch screen;
 a processor including a receiver, the processor communicatively coupled to the display unit, the receiver comprising:
  a digital phase interpolator including:
   a digital mixer to receive a plurality of clock signals and to generate phase signals based on the plurality of clock signals, wherein respective transitions of the phase signals are between transitions of the plurality of clock signals;
   a poly-phase filter, coupled to the digital mixer, to receive the phase signals and to generate a filtered signal, including the poly-phase filter to reduce a phase error of the phase signals;
   an output buffer, coupled to the poly-phase filter, to buffer the filtered signal and to generate a phase-interpolated signal based on the filtered signal; and
   a controller to digitally control generation of the phase signals by the digital mixer unit;
  a sampler coupled to the digital phase interpolator, the sampler to receive the phase-interpolated signal and to sample a signal based on the phase-interpolated signal; and
  an alignment unit to receive the sampled signal and to generate, based on the sampled signal, an output signal synchronized to a transmit clock signal domain;
  wherein the controller to receive a feedback based on the output signal, wherein the controller to digitally control generation of the phase signals based on the feedback; and
 a wireless interface for allowing the processor to communicate with other devices.

13. The tablet computer of claim 12, wherein the sampler to sample the signal based on the phase-interpolated signal includes the sampler to sample a data signal.

14. The tablet computer of claim 12, wherein the plurality of clock signals include quadrature clock signals.

15. The tablet computer of claim 14, wherein the digital mixer comprises a digital differential multiplexer which is operable to select one or more of the quadrature clock signals via digital input signals from the controller.

16. The tablet computer of claim 15, wherein the digital differential multiplexer comprises P and N transistors controlled by the digital differential multiplexer to provide common mode rejection to the phase signals.

17. The tablet computer of claim 15, wherein the digital input signals to cause the digital differential multiplexer to generate the phase signals with at least one or more of:
 a first phase with a transition edge in a middle of a phase of the signal;
 a second phase with a transition edge at a crossing of a phase of the signal and a successive phase of the signal;
 a third phase with a transition edge in a middle of the successive phase of the signal; and
 a fourth phase with a transition edge at the end of the phase of the successive phase of the signal.

\* \* \* \* \*